United States Patent
Ho et al.

(10) Patent No.: US 9,806,119 B2
(45) Date of Patent: Oct. 31, 2017

(54) 3DIC SEAL RING STRUCTURE AND METHODS OF FORMING SAME

(71) Applicant: Taiwan Semiconductor Manufacturing Company, Ltd., Hsin-Chu (TW)

(72) Inventors: Cheng-Ying Ho, Minxiong Township (TW); Pao-Tung Chen, Tainan Hsien (TW); Wen-De Wang, Minsyong Township (TW); Jen-Cheng Liu, Hsin-Chu (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 426 days.

(21) Appl. No.: 14/151,285

(22) Filed: Jan. 9, 2014

(65) Prior Publication Data

US 2015/0194455 A1    Jul. 9, 2015

(51) Int. Cl.
*H01L 21/768* (2006.01)
*H01L 27/146* (2006.01)
*H01L 23/58* (2006.01)

(52) U.S. Cl.
CPC ...... *H01L 27/14634* (2013.01); *H01L 23/585* (2013.01); *H01L 27/1469* (2013.01); *H01L 27/14636* (2013.01); *H01L 2924/0002* (2013.01)

(58) Field of Classification Search
CPC . H01L 27/146; H01L 23/58; H01L 27/14634; H01L 27/14636; H01L 23/585; H01L 27/1464; H01L 27/1469; H01L 2924/0002; H01L 2924/00

USPC ............................................ 438/109; 257/460
See application file for complete search history.

(56) References Cited

U.S. PATENT DOCUMENTS

| | | |
|---|---|---|
| 7,453,150 B1 | 11/2008 | McDonald |
| 7,642,173 B2 | 1/2010 | McDonald |
| 8,358,008 B2 | 1/2013 | Wada et al. |
| 8,421,193 B2 | 4/2013 | Huang |
| 2009/0250823 A1 | 10/2009 | Racz et al. |
| 2011/0127631 A1 | 6/2011 | Kawashima |

(Continued)

FOREIGN PATENT DOCUMENTS

| | | |
|---|---|---|
| CN | 102110696 A | 6/2011 |
| CN | 103311257 A | 9/2013 |
| CN | 103811506 A | 5/2014 |

*Primary Examiner* — Asok K Sarkar
*Assistant Examiner* — Dmitriy Yemelyanov
(74) *Attorney, Agent, or Firm* — Slater Matsil, LLP

(57) ABSTRACT

A semiconductor device includes a first semiconductor chip including a first substrate, a plurality of first dielectric layers and a plurality of conductive lines formed in the first dielectric layers over the first substrate. The semiconductor device further includes a second semiconductor chip having a surface bonded to a first surface of the first semiconductor chip, the second semiconductor chip including a second substrate, a plurality of second dielectric layers and a plurality of second conductive lines formed in the second dielectric layers over the second substrate. The semiconductor device further includes a first conductive feature extending from the first semiconductor chip to one of the plurality of second conductive lines, and a first seal ring structure extending from the first semiconductor chip to the second semiconductor chip.

20 Claims, 11 Drawing Sheets

(56) References Cited

U.S. PATENT DOCUMENTS

| | | |
|---|---|---|
| 2011/0171582 A1 | 7/2011 | Farooq et al. |
| 2011/0284843 A1 | 11/2011 | Chen et al. |
| 2013/0093098 A1 | 4/2013 | Yang et al. |
| 2013/0241022 A1 | 9/2013 | Oka |
| 2014/0124889 A1* | 5/2014 | Qian ................ H01L 27/14618 257/448 |
| 2014/0264862 A1* | 9/2014 | Tsai ....................... H01L 25/00 257/741 |

* cited by examiner

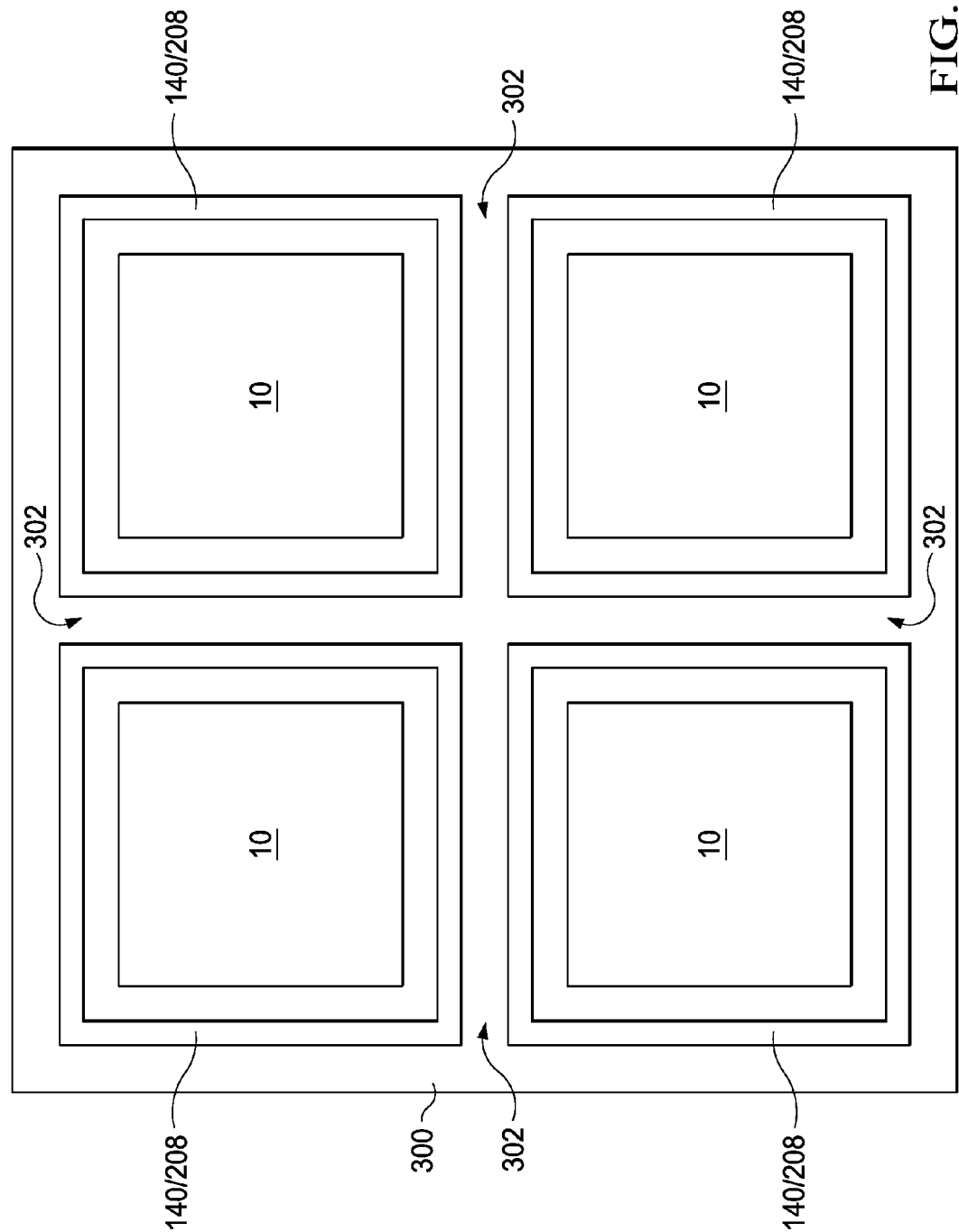

3DIC SEAL RING STRUCTURE AND METHODS OF FORMING SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be stacked and/or bonded on top of one another to further reduce the form factor of the semiconductor device.

During the manufacturing process, the semiconductor wafers go through many processing steps before the dies are separated by cutting the semiconductor wafer. The processing steps can include lithography, etching, doping, grinding, and/or depositing different materials. The processing steps can include wet and dry processing steps. The aforementioned processing steps can also be performed on the stacked semiconductor devices.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 2 is a plan view of a seal ring in accordance with an embodiment;

DETAILED DESCRIPTION OF ILLUSTRATIVE EMBODIMENTS

Figure 1A:
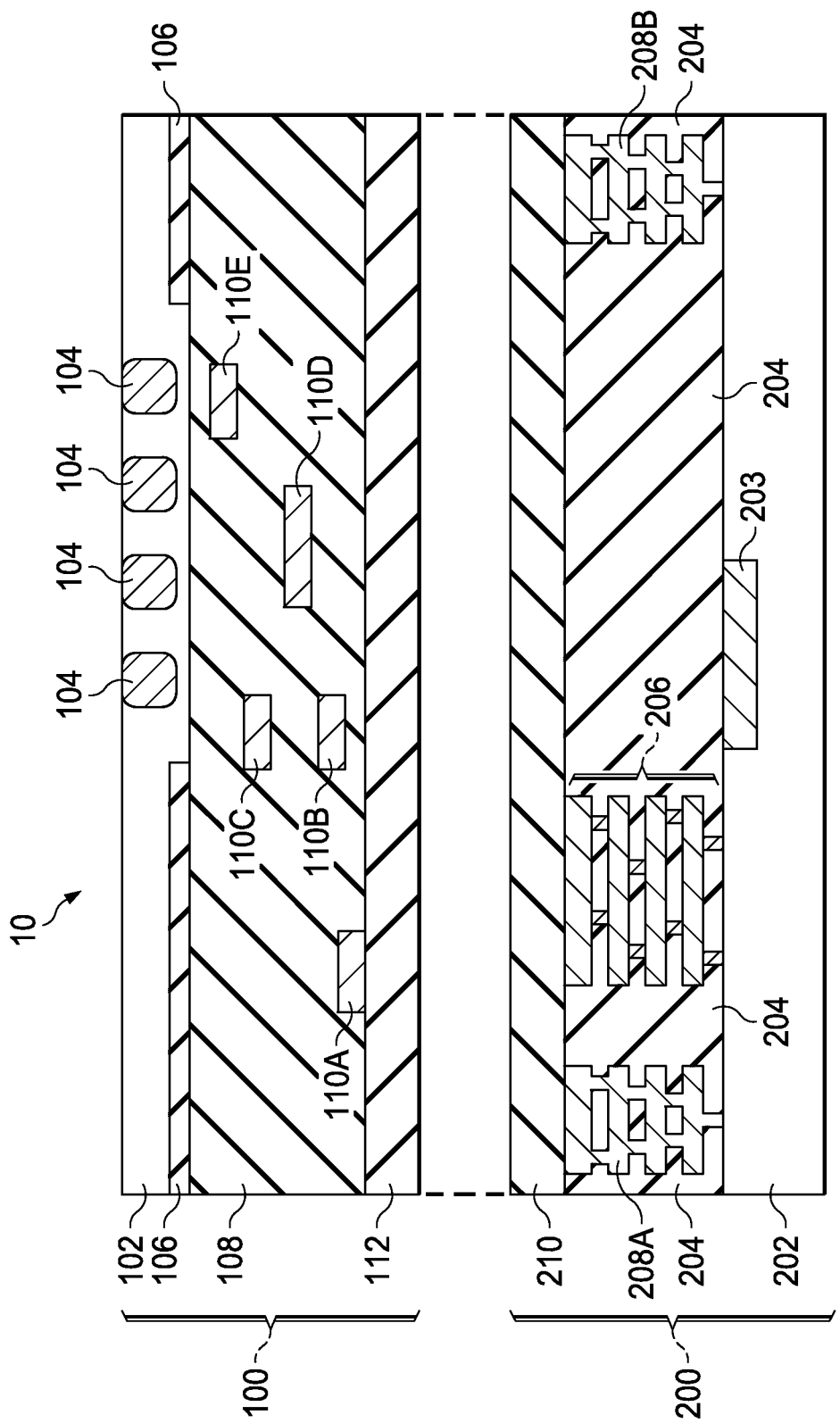
FIGS. 1A through 1E illustrate cross-sectional views of intermediate stages in the manufacturing of a seal ring in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a seal ring structure for a stacked semiconductor device. Other embodiments, however, may be applied to a variety of semiconductor devices. Hereinafter, various embodiments will be explained in detail with reference to the accompanying drawings.

FIGS. 1A through 1E illustrate various intermediate steps of forming a seal ring structure in a stacked semiconductor device 10 in accordance with an embodiment. Referring first to FIG. 1A, a first wafer 100 and a second wafer 200 are shown prior to a bonding process in accordance with various embodiments. In an embodiment, the first wafer 100 includes a first substrate 102 having a first electrical circuit (illustrated collectively by first electrical circuitry 104) formed therein. The first substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The first electrical circuitry 104 formed on the first substrate 102 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the first electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1A are isolation regions 106 on the first substrate 102. The isolation regions 106 extend from a surface of the first substrate 102 into the first substrate 102.

The isolation regions 106 may be Shallow Trench Isolation (STI) regions, and are referred to as STI regions 106 hereinafter. The formation of the STI regions 106 may include etching the first substrate 102 to form trenches (not shown), and filling the trenches with a dielectric material to form the STI regions 106. The STI regions 106 may be formed of silicon oxide deposited by a high density plasma, for example, although other dielectric materials formed according to various techniques may also be used.

An interconnect structure is formed over the substrate 102 and the STI regions 106. The interconnect structure includes one or more dielectric layers 108 and one or more interconnect lines 110A-110E (collectively referred to as first interconnect lines 110). The dielectric layers 108 may be interlayer dielectric (ILD)/inter-metallization dielectric (IMD) layers 108. In an embodiment, the dielectric layers 108 are formed of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD).

The first interconnect lines 110 form metallization layers over the first substrate 102 to interconnect the first electrical circuitry 104 and to provide an external electrical connection, such as to the second wafer 200. The first interconnect lines 110 may be formed by a damascene process, such as single damascene or a dual damascene process. The first interconnect lines 110 are formed of a conductive material and may be lined with a diffusion barrier layer and/or an adhesion layer (not shown). The diffusion barrier layer may be formed of one or more layers of TaN, Ta, TiN, Ti, CoW, or the like, and the conductive material may be formed of copper, tungsten, aluminum, silver, and combinations thereof, or the like, thereby forming the first interconnect lines 110 as illustrated in FIG. 1A.

It should also be noted that one or more etch stop layers (not shown) may be positioned between adjacent ones of the ILD/IMD layers, e.g., the dielectric layers 108. Generally, the etch stop layers provide a mechanism to stop an etching process when forming vias and/or contacts. The etch stop layers are formed of a dielectric material having a different etch selectivity from adjacent layers, e.g., the underlying first substrate 102 and the overlying ILD/IMD layers 108. In an embodiment, the etch stop layers may be formed of SiN, SiCN, SiCO, CN, combinations thereof, or the like, deposited by CVD or PECVD techniques.

A first passivation layer 112 is formed over the dielectric layers 108 and the first interconnect lines 110. The first passivation layer 112 may be used as a bonding interface between the first and second wafers 100 and 200 and may be bonded to a second passivation layer 210 on the second wafer 200 as discussed below. The first passivation layer 112 may be formed of similar materials and by similar processes as the dielectric layers 108 and the description will not be repeated herein, although the first passivation layer 112 and the first dielectric layers 108 need not be the same.

The second wafer 200 includes a second substrate 202 having a second electrical circuit (illustrated collectively by second electrical circuitry 203) formed therein, and the second wafer 200 includes an interconnect structure including second dielectric layers 204 and second interconnect lines 206 over the second substrate 202 and the second electrical circuitry 203. The second substrate 202, the second electrical circuitry 203, the second dielectric layers 204, and the second interconnect lines 206 may be similar to the first substrate 102, the first electrical circuitry 104, the first dielectric layers 108, and the first interconnect lines 110, respectively, although the components of the first and second wafers 100 and 200 need not be the same.

The second wafer 200 further includes a second seal ring structure 208A and 208B (collectively referred to as second seal ring structure 208) in the interconnect structure. The second seal ring structure 208 may provide protection for the second wafer 200 from water, chemicals, residue, and/or contaminants that may be present during the processing of the first and second wafers 100 and 200. The second seal ring structure 208 may be formed along a periphery of the second substrate 202. As illustrated in FIG. 2, discussed further below, the second seal ring structure 208 is a continuous structure formed to surround the singulated second die/wafer 200. The second seal ring structure 208 may be formed of a conductive material. In an embodiment, the second seal ring structure 208 is formed by a same material and by a same process(es) as the second interconnect lines 206.

A second passivation layer 210 is formed over the second dielectric layers 204, the second interconnect lines 206, and the second seal ring structure 208. The second passivation layer 210 may be used as a bonding interface between the first and second wafers 100 and 200 and may be bonded to the first passivation layer 112 on the first wafer 100. The second passivation layer 210 may be formed of similar materials and by similar processes as the second dielectric layers 204 and the description will not be repeated herein, although the second passivation layer 210 and the second dielectric layers 204 need not be the same.

In an embodiment, the first wafer 100 is a backside-illuminated (BSI) sensor and the second wafer 200 is a logic circuit, such as an ASIC device. The BSI sensor may be formed in an epitaxial layer over a silicon substrate. In this embodiment, the electrical circuitry 104 includes photo-active regions, such as photo-diodes formed by implanting impurity ions into the epitaxial layer. Furthermore, the photo-active regions may be a PN junction photo-diode, a PNP photo-transistor, an NPN photo-transistor or the like.

The second wafer 200 may include a logic circuit, an analog-to-digital converter, a data processing circuit, a memory circuit, a bias circuit, a reference circuit, and the like.

Figure 1B:
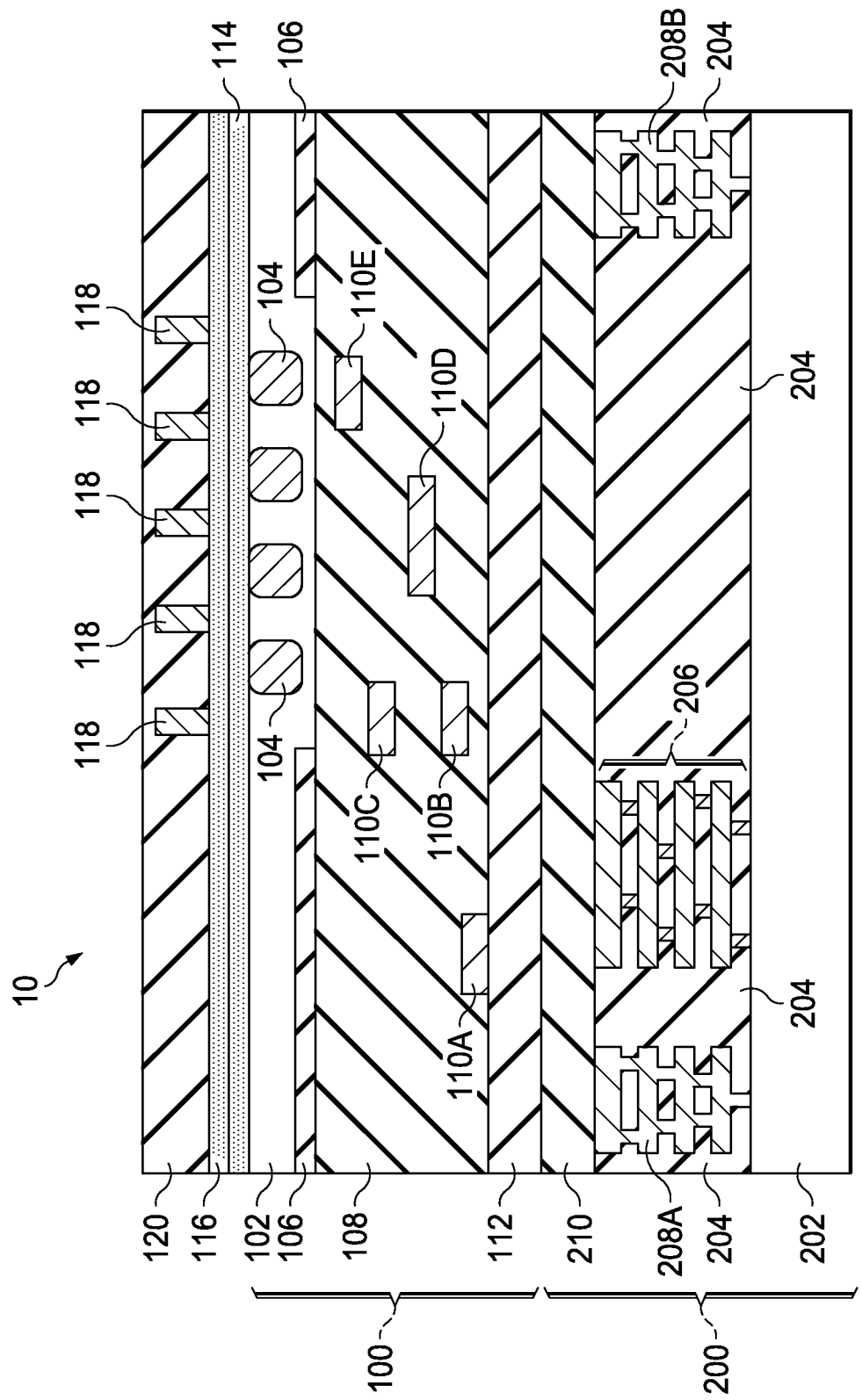

FIG. 1B illustrates the first wafer 100 and the second wafer 200 after bonding in accordance with an embodiment. In an embodiment, the first wafer 100 and the second wafer 200 are arranged with the device sides of the first substrate 102 and the second substrate 202 facing each other as illustrated in FIG. 1A and the wafers may be bonded face-to-face. The first wafer 100 and the second wafer 200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

It should be noted that the bonding may be at wafer level, wherein the first wafer 100 and the second wafer 200 are bonded together, and are then singulated into separated dies. Alternatively, the bonding may be performed at the die-to-die level, or the die-to-wafer level.

After the first wafer 100 and the second wafer 200 are bonded, a thinning process may be applied to the backside of the first wafer 100. In an embodiment in which the first substrate 102 is a BSI sensor, the thinning process serves to allow more light to pass through from the backside of the first substrate to the photo-active regions without being absorbed by the substrate. In an embodiment in which the BSI sensor is fabricated in an epitaxial layer, the backside of the first wafer 100 may be thinned until the epitaxial layer is exposed. The thinning process may be implemented by using suitable techniques such as grinding, polishing, a SMARTCUT® procedure, an ELTRAN® procedure, and/or chemical etching.

In an embodiment in which that first substrate 102 is a BSI sensor, after the step of thinning, buffer layers 114 and 116 (also sometimes referred to as upper layers) are formed on the backside surface of first substrate 102. In some embodiments, the buffer layers 114 and 116 include one or more of a bottom anti-reflective coating (BARC) 114 and a silicon oxide layer 116. The silicon oxide layer 116 may be formed using plasma-enhanced CVD (PECVD), and hence is referred to as plasma-enhanced (PE) oxide layer 116. It is appreciated that buffer layers 114 and 116 may have different structures, formed of different materials, and/or have different number of layers other than illustrated.

In the BSI sensor embodiments, a metal grid 118 is formed over buffer layers 114 and 116. The metal grid 118 may be formed of a metal or a metal alloy including tungsten, aluminum, copper, the like, or combinations thereof. The metal grid 118 has the shape of a grid, wherein the photo-active regions 104 are aligned to the grid openings of the metal grid 118. A dielectric layer 120 is filled into the grid openings of the metal grid 118. In some embodiments, the dielectric layer 44 is a silicon oxide and is formed by a PECVD process. The top surface of dielectric layer 120 may be planarized and may be higher than the top surface of metal grid 118.

Figure 1C:
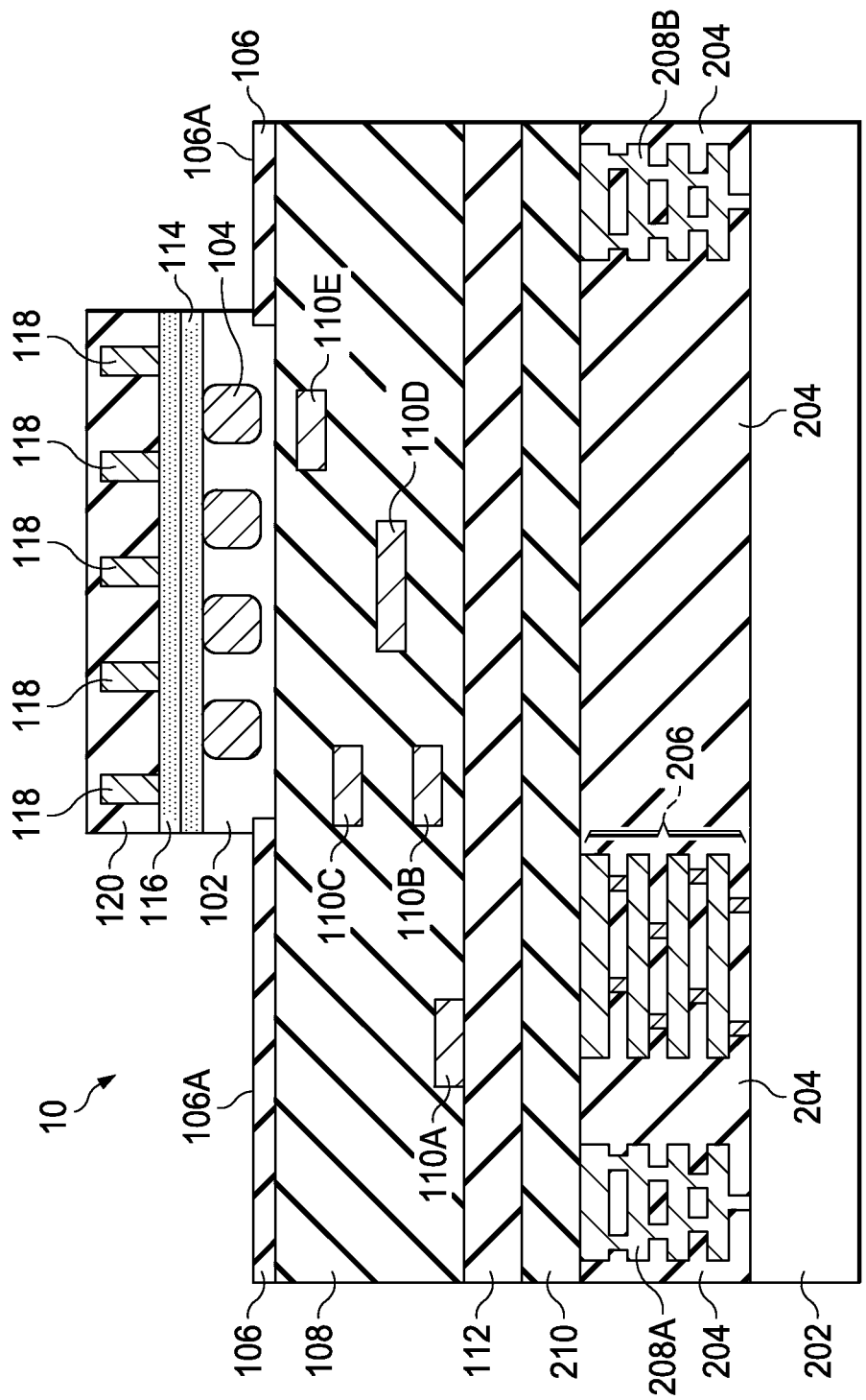

FIG. 1C illustrates the patterning of the dielectric layer 120, the buffer layers 114 and 116, and the first substrate 102 to expose a surface 106A of the STI regions 106. The dielectric layer 120, the buffer layers 114 and 116, and the first substrate 102 are patterned to allow the formation of conductive features from the backside of the first wafer 100 to the first and second interconnect lines 110 and 206 and also the formation of a first seal ring structure 140 as discussed in greater detail below. The patterning process may also expose the scribe line area (sometimes referred to as a saw street) along which the first and second wafers 100 and 200 will be singulated. The patterning process may be performed using photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching. Other layers may be used in the patterning process. For example, one or more optional hard mask layers may be used to pattern the first substrate 102. Generally, one or more hard mask layers may be useful in embodiments in which the etching process requires masking in addition to the masking provided by the photoresist material.

Figure 1D:
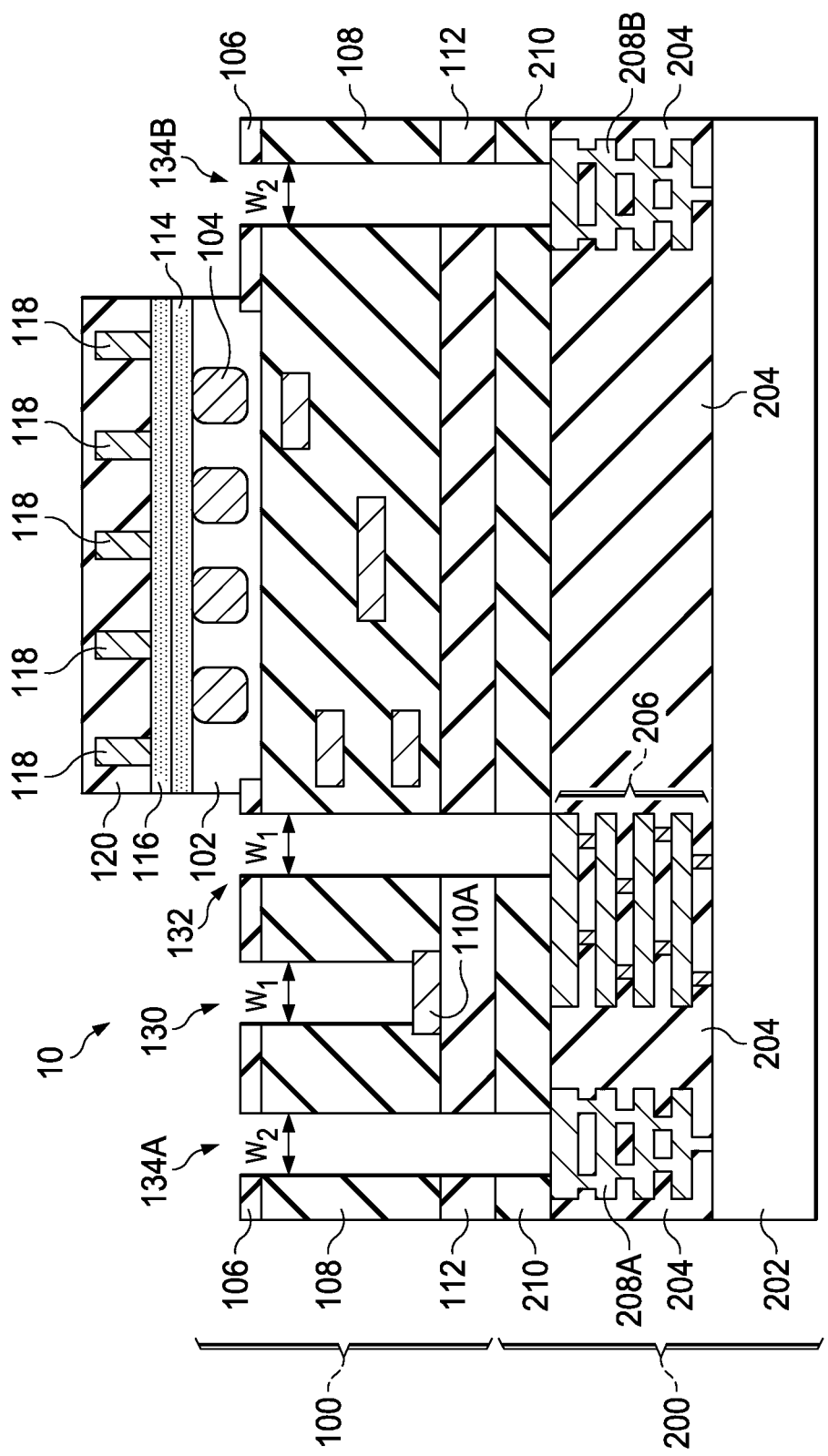

FIG. 1D illustrates the formation of one or more openings extending from the backside of the first wafer 100. A first opening 130 is formed from the backside of the first wafer 100 to expose a portion of the first interconnect line 110A. The first opening 130 represents the opening in which a conductive feature will be formed to provide external connection to the first interconnect lines 110. A second opening 132 is formed from the backside of the first wafer 100 to extend through the first dielectric layers 108, the first passivation layer 112, and the second passivation layer 210 to expose a portion of second interconnect lines 206. The second opening 132 represents the opening in which a conductive feature will be formed to provide external connection to the second interconnect lines 206. In an embodiment, the first and second openings 130 and 132 are formed to have a width $W_1$ from about 1 μm to about 10 μm. The third and fourth openings 134A and 134B are formed to expose portions of the second seal ring structure 208A and 208B, respectively. The third and fourth openings 134A and 134B represent the openings in which a first seal ring structure will be formed to provide protection to first wafer 100 and to the bonding interface between the first and second passivation layers 112 and 210. In an embodiment, the third and fourth openings 134A and 134B are formed to have a width $W_2$ from about 1 μm to about 10 μm. In some embodiments, the third and fourth openings 134A and 134B are part of a single, continuous opening along the periphery of first and second wafers 100 and 200. In an embodiment, the third and fourth openings 134A and 134B may be formed at a same time and by a same process(es) as the second opening 132.

Figure 1E:
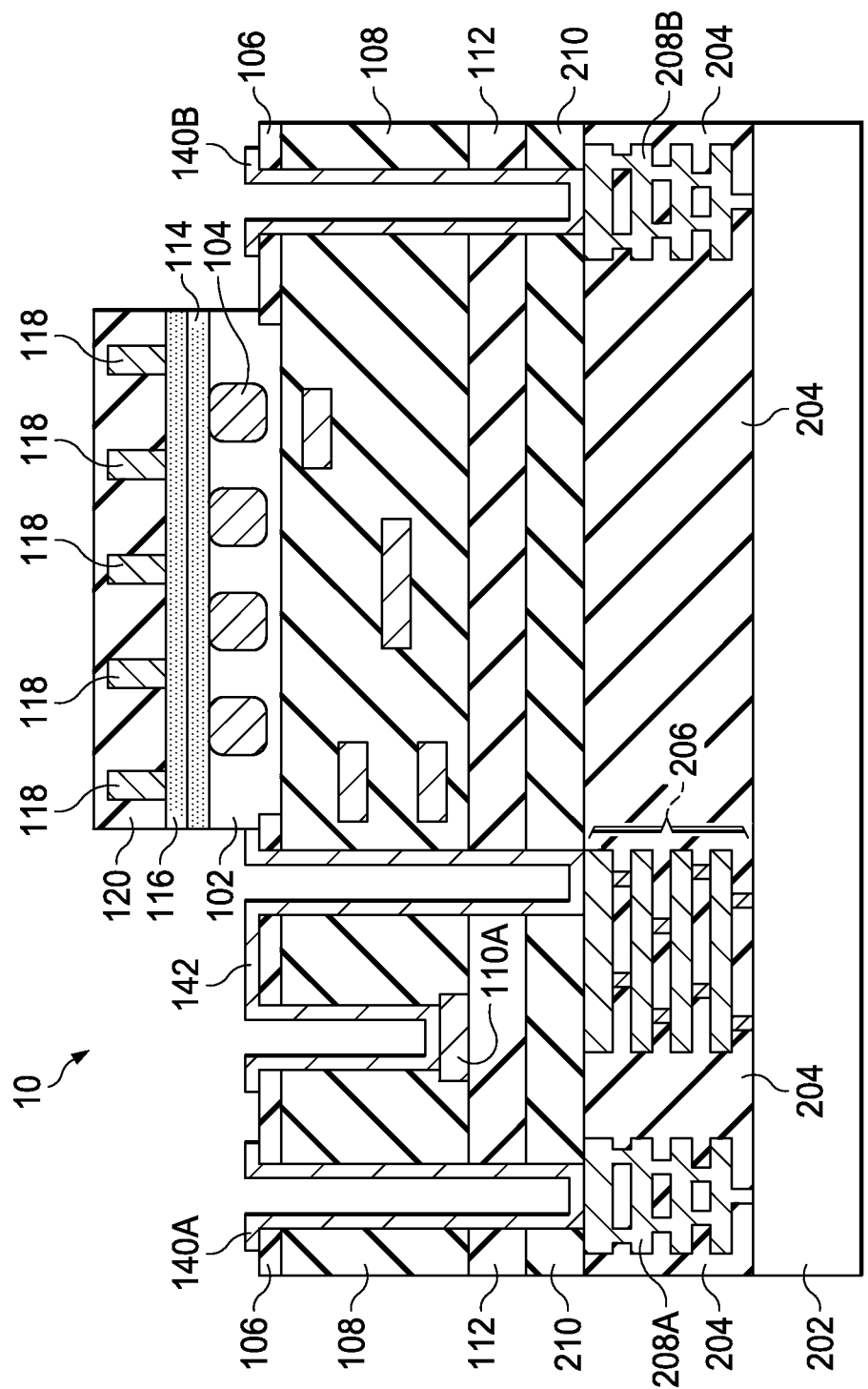

FIG. 1E illustrates the formation of conductive features and seal ring structures in the openings. A conductive feature 142 is formed in the first and second openings 130 and 132 and is electrically coupled to the first and second interconnect lines 110 and 206. The seal ring structures 140A and 140B (collectively referred to as first seal ring structure 140) are formed in the third and fourth openings 134A and 134B, respectively, and are directly contacting the second seal ring structure 208A and 208B, respectively. The first seal ring structure 140 is not electrically coupled to any active devices. The first seal ring structure 140 is formed at a same time and by a same process(es) as the conductive features 142. In an embodiment, the conductive feature 142 and the first seal ring structure 140 are made of aluminum, tungsten, copper, the like, or a combination thereof. The conductive feature 142 and the first seal ring structure 140 may be formed through a deposition process such as electrochemical plating, physical vapor deposition (PVD), CVD, the like, or a combination thereof. In some embodiments, the conductive feature 142 and the first seal ring structure 140 are formed on a seed layer (not shown). In an embodiment, the conductive feature 142 includes two separate conductive features 142 with a first conductive feature being coupled to the first interconnect lines 110 and a second conductive feature being coupled to the second interconnect lines 206. In this embodiment, the first conductive feature and the second conductive feature may be electrically isolated from each other.

After the formation of the conductive feature 142 and the first seal ring structure 140, wire bonds or conductive bumps may be formed in contact with the conductive features 142 to provide external connections to the first and second interconnect lines 110 and 206.

By having the first seal ring structure 140 extend through the bonding interface of the first and second wafers 100 and 200, the seal ring structure 140 can provide protection for the bonding interface. For example, in FIG. 1E, the bonding interface includes the first and second passivation layers 112 and 210 and the first and second passivation layers 112 and 210 may allow water, chemicals, residue, or other contaminants to penetrate the bonding interface and to attack the components of the first and second wafers 100 and 200. The first seal ring structure 140 is not porous and can prevent the penetration of water, chemicals, residue, or other contaminants from entering the bonding interface which may increase the yield of the stacked semiconductor device 10. In addition, the seal ring structure 140 is formed at a same time and by a same process(es) as the conductive feature 142, and thus, no extra masks or processing steps are needed to form the seal ring structure.

FIG. 2 illustrates a plan view of a wafer 300 including multiple stacked semiconductor devices 10. As illustrated, each of the stacked semiconductor devices 10 are surrounded by the first and second seal ring structures 140 and 208. The areas 302 between the stacked semiconductor devices 10 may be referred to as the scribe line areas 302 or the saw streets 302. The stacked semiconductor devices 10 may be singulated along the areas 302 by a cutting apparatus, such as a laser or a die saw. The seal ring structures 140/208 may also prevent peeling or chipping of the wafer 300 during the singulating process.

A single square/rectangular shape for the seal ring structure 140/208 is shown in FIG. 2 for illustrative purposes only. In other embodiments, the seal ring structure 140/208 may comprise a plurality of shapes, such as a circular seal ring structure 140/208. In addition, the seal ring structure 140/208 may comprise a plurality of concentric seal ring structures successively surrounding the stacked semiconductor devices 10.

Figure 3:
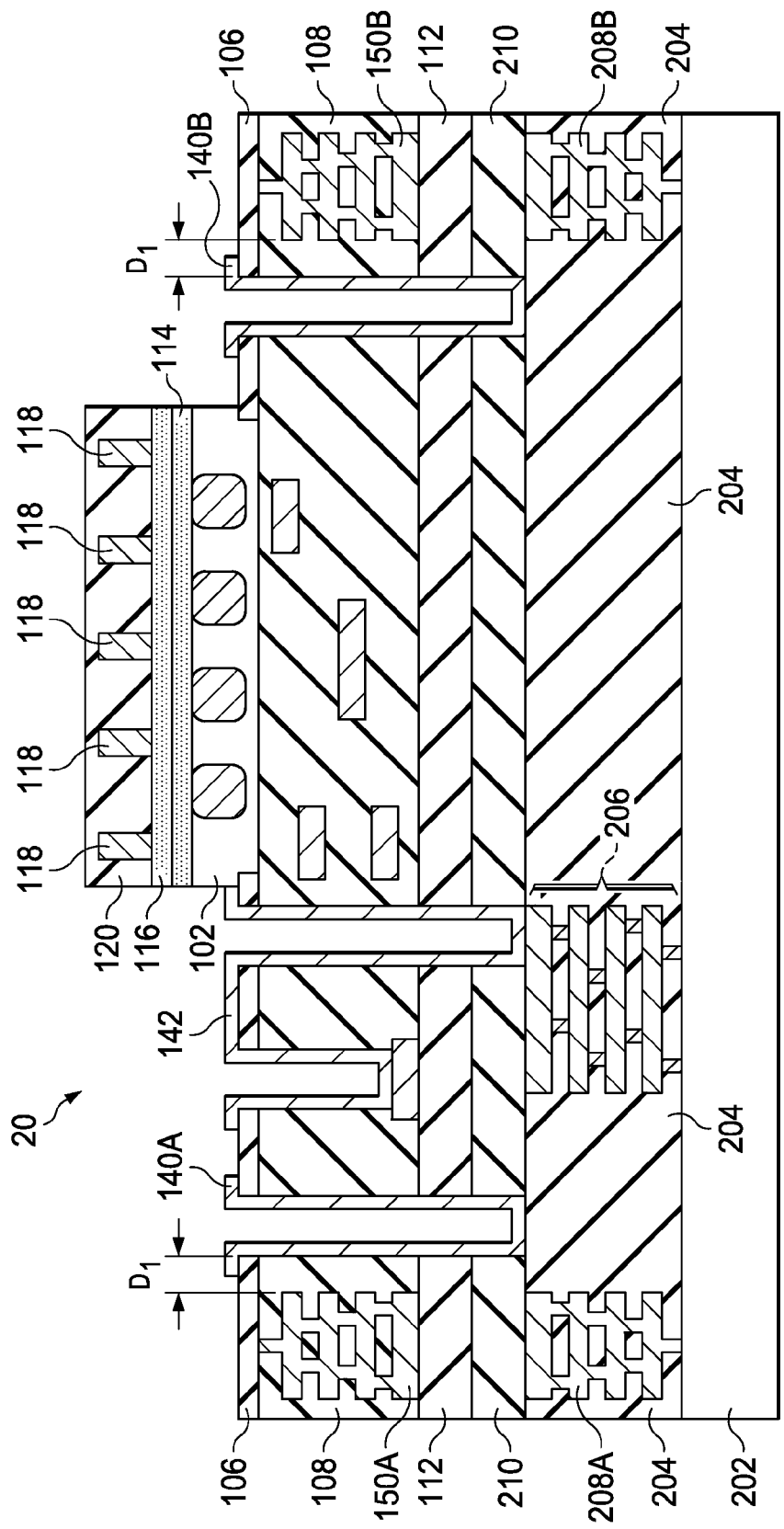
FIG. 3 illustrates a cross-sectional view of a seal ring in accordance with another embodiment.

FIG. 3 illustrates a stacked semiconductor device 20 including a first seal ring structure 140 in accordance with another embodiment. The semiconductor device 20 is similar to the stacked semiconductor device 10 in FIG. 1E except that the first seal ring structure 140 is laterally offset from the second seal ring structure 208 and an optional third seal ring structure 150 and is not in physical contact with the second seal ring structure 208. Details regarding this embodiment that are similar to those for the previously described embodiment will not be repeated herein.

In this embodiment, the first seal ring structure 140 is laterally offset by a distance $D_1$ from the second seal ring structure 208 and the optional third seal ring structure 150. The distance $D_1$ is the distance between an edge of the seal ring structure 150 and an edge of the first seal ring structure 140. In an embodiment, the distance $D_1$ is at least 100 nm to allow sufficient process window consideration. Although the first seal ring structure 140 is offset inside of the second seal ring structure 208 in FIG. 3, the first seal ring structure 140 may be offset outside of the second seal ring structure 208 by the distance $D_1$ (see FIG. 5). The stacked semiconductor device 20 also includes an optional third seal ring structures 150A and 150B (collectively referred to as the third seal ring structure 150) in the first wafer 100. The third seal ring structure 150 is similar to the second seal ring 208 and the description is not repeated herein, although the third seal ring structure 150 and the second seal ring structure 208 need not be the same.

Figure 4:
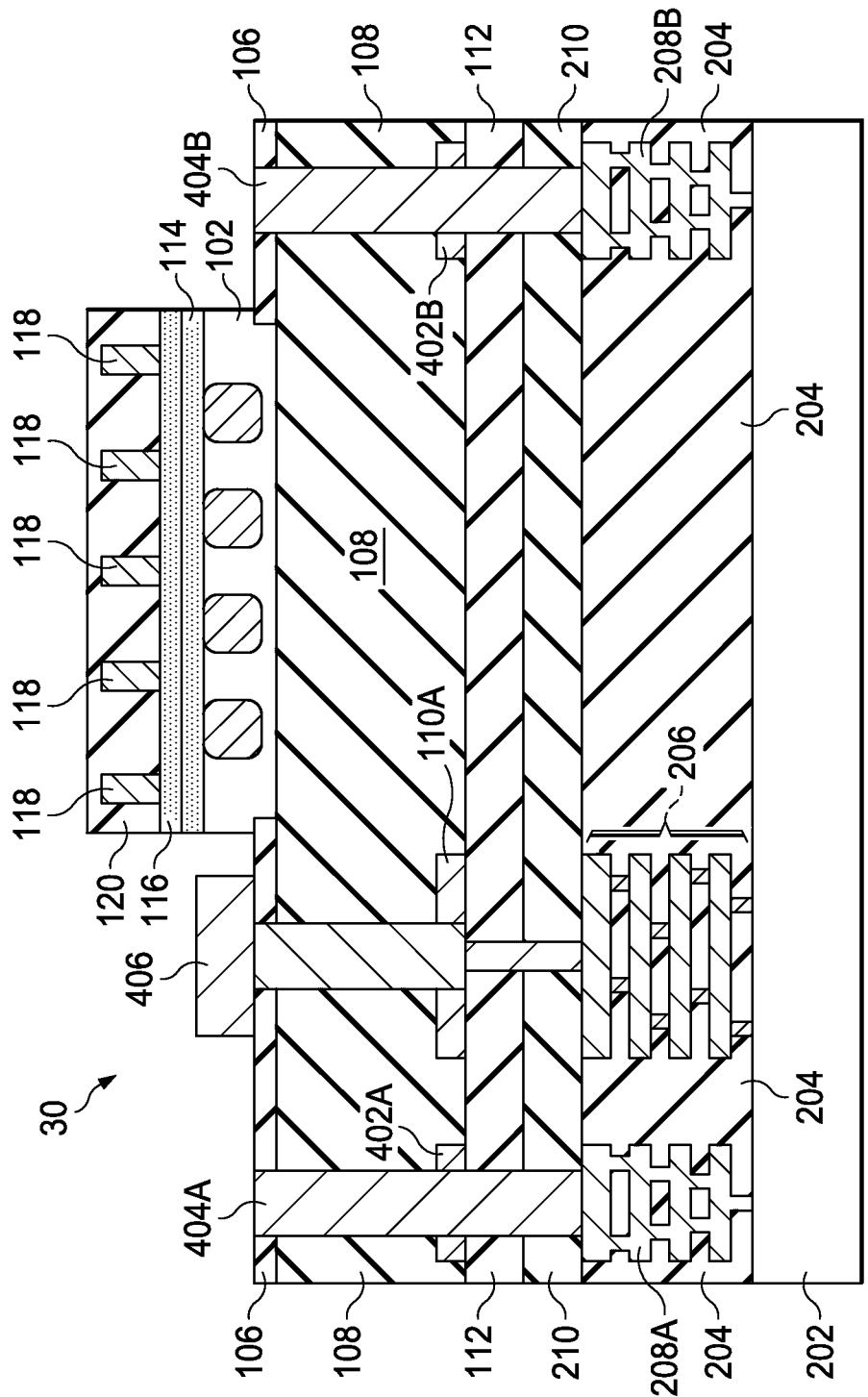
FIG. 4 illustrates a cross-sectional view of a seal ring in accordance with another embodiment.

FIG. 4 illustrates a stacked semiconductor device 30 including a seal ring structure 404A and 404B (collectively referred to as seal ring structure 404) in the first wafer 100 and in accordance with another embodiment. The semiconductor device 30 is similar to the stacked semiconductor device 10 in FIG. 1E except that the conductive feature 406 that couples the first and second interconnect lines 110 and 206 is a conductive plug, and thus, the seal ring structure 404 is a filled, conductive component. The seal ring structure 404 is a continuous structure formed to surround the singulated die/wafer (see seal ring structure 140/208 in FIG. 2). Details regarding this embodiment that are similar to those for the previously described embodiment will not be repeated herein.

In this embodiment, the conductive feature 406 is formed extending from the backside of the first wafer 100 to the first interconnect line 110A and through the first and second passivation layers 112 and 210 to the second conductive lines 206. The opening for the conductive feature 406 may be formed in multiple etching steps. For example, a first etch step etch through the first substrate 102, a second etch step may etch through the dielectric layers 108, and a third etch step may etch through the first and second passivation layers 112 and 210. These etch steps may form openings of various widths as illustrated by the multiple widths of the conductive feature 406. The openings may be filled a conductive material, such as tungsten, titanium, aluminum, copper, any combinations thereof and/or the like, is filled into the openings, using, for example, an electro-chemical plating process, thereby forming a conductive plug 406. In an embodiment, the conductive plug 406 may include or more diffusion and/or barrier layers and a seed layer (not shown) formed in the openings before the conductive material is formed. For example, the diffusion barrier layer comprising one or more layers of Ta, TaN, TiN, Ti, CoW, or the like is formed along the sidewalls of the openings, and the seed layer may be formed of copper, nickel, gold, any combination thereof and/or the like.

The seal ring structure 404 is directly contacting the second seal ring structure 208A and 208B, respectively. The seal ring structure 404 is not electrically coupled to any active devices. The seal ring structure 404 is formed at a same time and by the same process(es) as the conductive plug 406. For example, the opening for the seal ring structure 404 may be formed simultaneously with the openings for the conductive plug 406 and the conductive material of the seal ring structure 404 may be formed simultaneously with the conductive material of the conductive plug 406.

Figure 5:
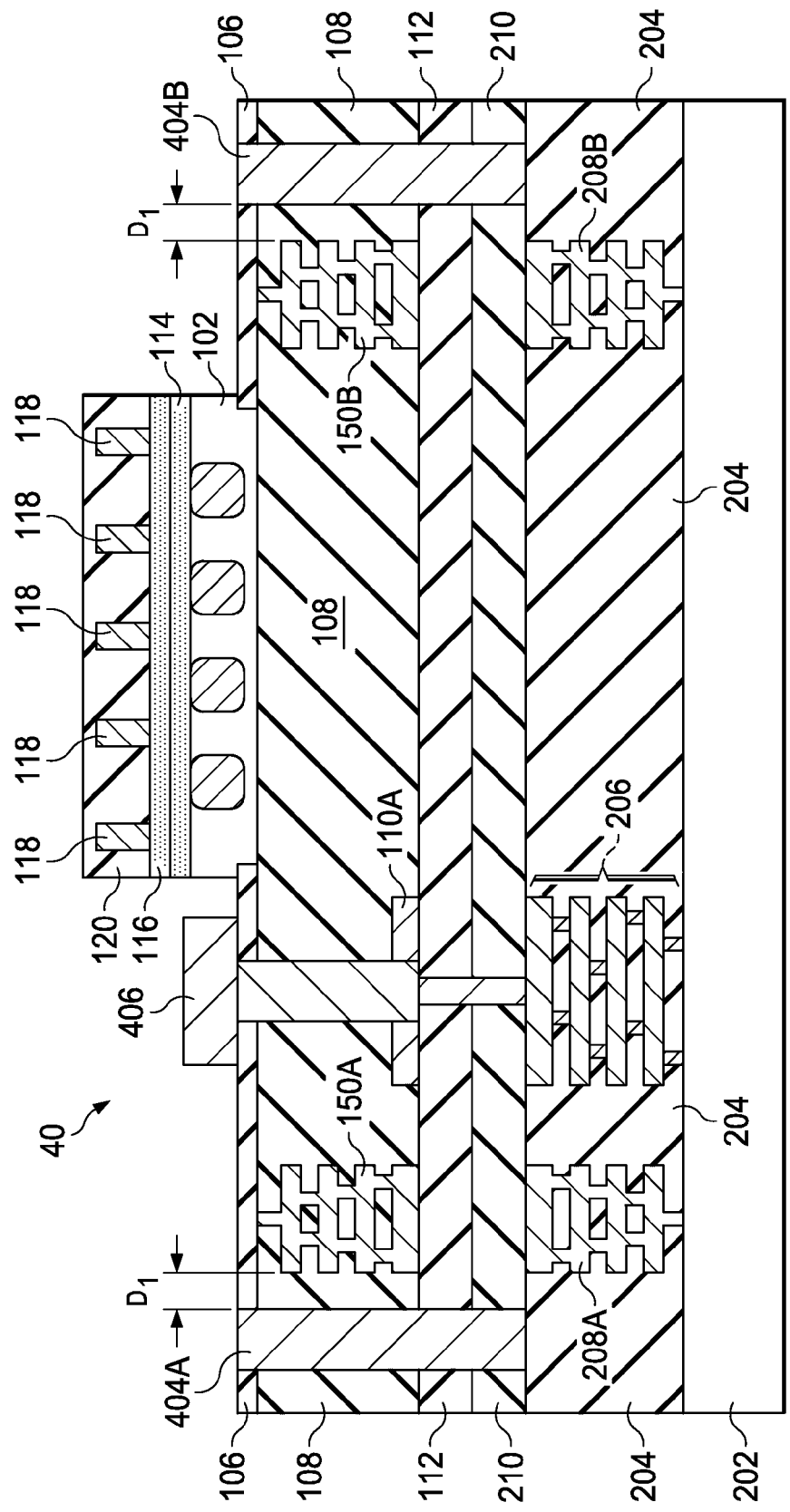
FIG. 5 illustrates a cross-sectional view of a seal ring in accordance with another embodiment.

FIG. 5 illustrates a stacked semiconductor device 40 including a seal ring structure 404 in accordance with another embodiment. The semiconductor device 40 is similar to the stacked semiconductor device 30 in FIG. 4 except that the seal ring structure 404 is laterally offset from the second seal ring structure 208 and the optional third seal ring structure 150 and is not in physical contact with the second seal ring structure 208. Details regarding this embodiment that are similar to those for the previously described embodiment will not be repeated herein.

In this embodiment, the seal ring structure 404 is laterally offset by the distance $D_1$ from the second seal ring structure 208 and the optional third seal ring structure 150. Although the seal ring structure 404 is offset outside of the second seal ring structure 208 in FIG. 5, the seal ring structure 404 may be offset inside of the second seal ring structure 208 by the distance $D_1$ (see FIG. 3).

Figure 6:
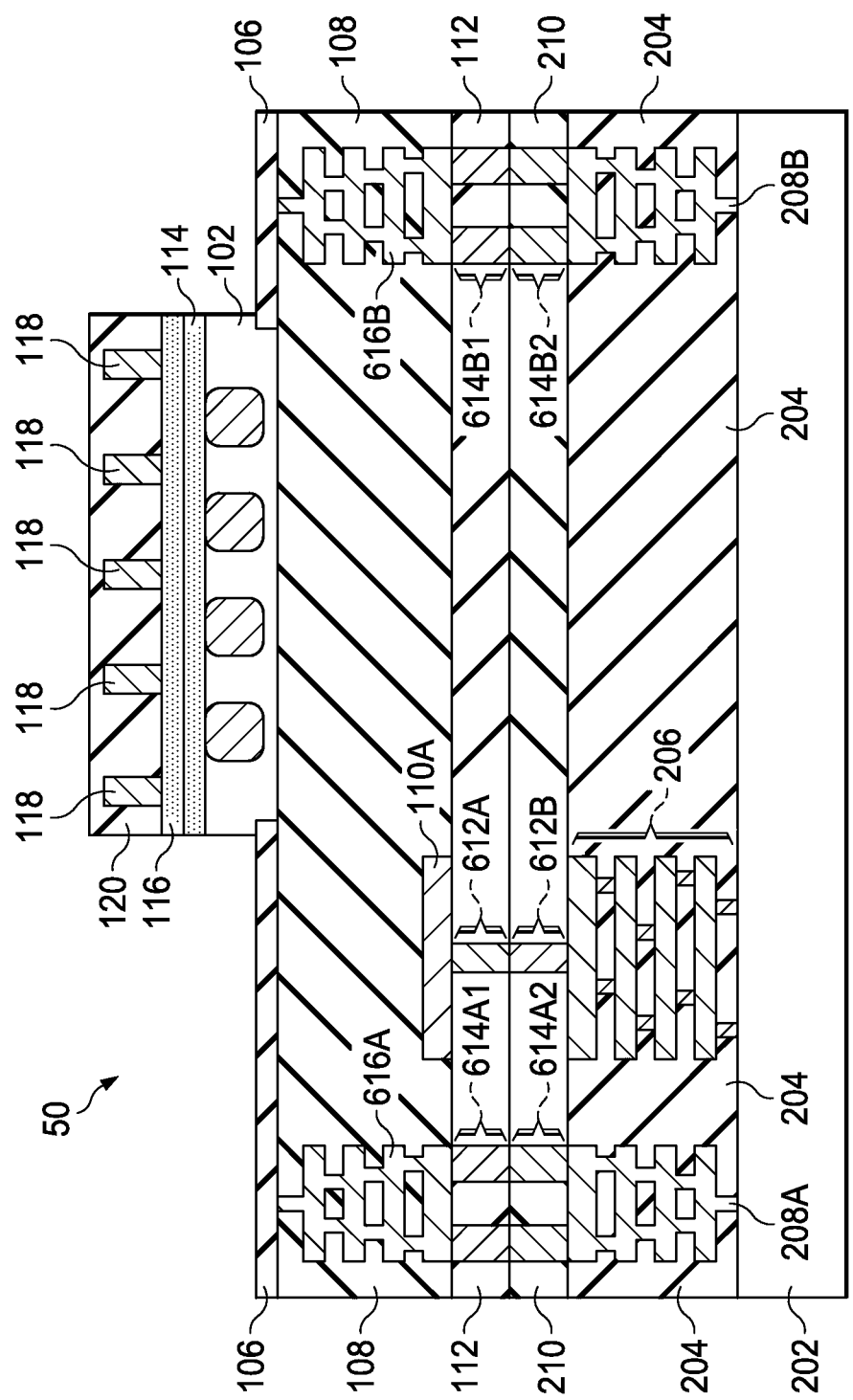
FIG. 6 illustrates a cross-sectional view of a seal ring in accordance with another embodiment.

FIG. 6 illustrates a stacked semiconductor device 50 including a seal ring structure 614A1, 614A2, 614B1, and 614B2 (collectively referred to as seal ring structure 614) in the first second passivation layers 112 and 210 in accordance with another embodiment. The semiconductor device 50 is similar to the stacked semiconductor device 10 in FIG. 1E except that the conductive feature 612A and 612B (collectively referred to as conductive feature 612) that couples the first and second interconnect lines 110 and 206 is formed as a conductive via though the first and second passivation layers 112 and 210, and thus, the seal ring structure 614 is a conductive via structure. Details regarding this embodiment that are similar to those for the previously described embodiment will not be repeated herein.

The stacked semiconductor device 50 also includes a seal ring structure 616A and 616B (collectively referred to as seal ring structure 616) in the first wafer 100. The seal ring structure 616 is similar to the second seal ring 208 and the description is not repeated herein, although the seal ring structure 616 and the second seal ring structure 208 need not be the same. In this embodiment, the first and second wafers 100 and 200 may be bonded together using a hybrid bonding process such that there is both a metal-to-metal bonding (e.g. between 614A1 and 614A2, 614B1 and 614B2, and 612A and 612B) and a dielectric-to-dielectric bonding (e.g. between the first and second passivation layers 112 and 210).

In this embodiment, the conductive feature 612 is formed extending from the first interconnect lines 110 through the first passivation layer 112 and the second passivation layer 210 to the second interconnect lines 206. In an embodiment, the conductive feature 612 extends from the top metal layer of the first interconnect lines 110 to the top metal layer of the second interconnect lines 206. The conductive feature 612 includes two portions with a first portion 612A in the first passivation layer 112 and a second portion 612B in the second passivation layer 210. The first portion 612A and the second portion 612B are formed in the first and second passivation layers 112 and 210 before the first and second wafers 100 and 200 are bonded together. When the first and second wafers 100 and 200 are bonded together (see FIG. 1B), the first and second portions 612A and 612B are bonded together to form the conductive via 612. The conductive via 612 may be formed of a conductive material, such as tungsten, titanium, aluminum, copper, any combinations thereof and/or the like, is formed, using, for example, an electro-chemical plating process. In an embodiment, the conductive via 612 may include or more diffusion and/or barrier layers and a seed layer (not shown) formed in the openings before the conductive material is formed. For example, the diffusion barrier layer may include one or more layers of Ta, TaN, TiN, Ti, CoW, or the like is formed along the sidewalls of the conductive via 612, and the seed layer may be formed of copper, nickel, gold, any combination thereof, and/or the like.

The seal ring structure 614 extends from the seal ring structure 616 in the first wafer 100 to the second seal ring structure 208 in the second wafer 200. The seal ring structure 614 is directly contacting both the seal ring structure 616 and the second seal ring structure 208. The seal ring structure 616 is not electrically coupled to any active devices. The seal ring structure 616 is formed at a same time and by the same process(es) as the conductive via 612. For example, the opening for the seal ring structure 614 may be formed simultaneously with the openings for the conductive via 612 and the conductive material of the seal ring structure 614 may be formed simultaneously with the conductive material of the conductive via 612.

Figure 7:
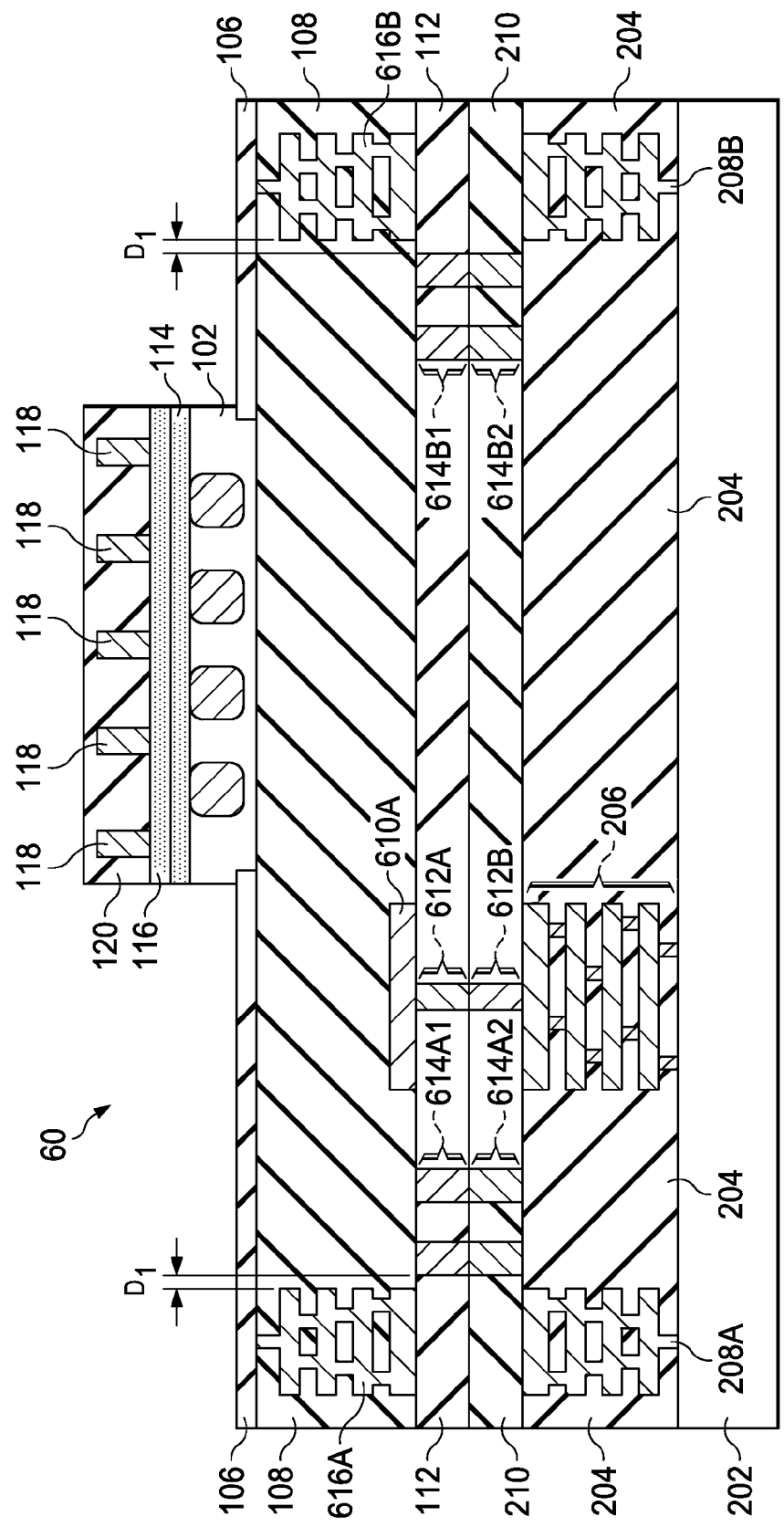
FIG. 7 illustrates a cross-sectional view of a seal ring in accordance with another embodiment.

FIG. 7 illustrates a stacked semiconductor device 60 including a seal ring structure 614 in accordance with another embodiment. The semiconductor device 60 is similar to the stacked semiconductor device 50 in FIG. 6 except that the seal ring structure 616 is laterally offset from the seal ring structures 616 and 208 and is not in physical contact with the seal ring structures 616 and 208. Details regarding this embodiment that are similar to those for the previously described embodiment will not be repeated herein.

In this embodiment, the seal ring structure 614 is laterally offset by the distance $D_1$ from the seal ring structures 616 and 208. The distance $D_1$ is the distance between an edge of the seal ring structure 616 and an edge of the seal ring structure 614. Although the seal ring structure 614 is offset inside of the seal ring structures 616 and 208 in FIG. 7, the seal ring structure 614 may be offset outside of the seal ring structures 616 and 208 by the distance $D_1$ (see FIG. 5).

By having a seal ring structure extend through the bonding interface of the first and second wafers, the seal ring structure can provide protection for the bonding interface. For example, in some embodiments, the bonding interface includes passivation layers that may allow water, chemicals, residue, or other contaminants to penetrate the bonding interface and to attack the components of the first and second wafers. The seal ring structure formed in the bonding interface is not porous and can prevent the penetration of water, chemicals, residue, or other contaminants from entering the bonding interface which may increase the yield of the stacked semiconductor devices. In addition, the seal ring structure is formed at a same time and by the same process (es) as a conductive feature, which extends through bonding interface, and thus, no extra masks or processing steps are needed to form the seal ring structure.

An embodiment is a semiconductor device including a first semiconductor chip including a first substrate, a plurality of first dielectric layers and a plurality of conductive lines formed in the first dielectric layers over the first substrate. The semiconductor device further includes a second semiconductor chip having a surface bonded to a first surface of the first semiconductor chip, the second semiconductor chip including a second substrate, a plurality of second dielectric layers and a plurality of second conductive lines formed in the second dielectric layers over the second substrate. The semiconductor device further includes a first conductive feature extending from the first semiconductor chip to one of the plurality of second conductive lines, and a first seal ring structure extending from the first semiconductor chip to the second semiconductor chip.

Another embodiment is a method of forming a semiconductor device, the method including providing a first chip, the first chip having a substrate and a plurality of dielectric layers, the plurality of dielectric layers having metallization layers formed therein, and bonding a first surface of the plurality of dielectric layers of the first chip to a surface of a second chip. The method further includes forming a first conductive feature extending from the first chip to a metallization layer in the second chip, and forming a first seal ring structure extending from the first chip to the second chip.

A further embodiment is a method of forming a semiconductor device, the method including providing a first substrate having one or more overlying first dielectric layers and a first conductive interconnect in the one or more first dielectric layers, and providing a second substrate having one or more overlying second dielectric layers, a second conductive interconnect in the one or more second dielectric layers, and a first seal ring structure in the one or more second dielectric layers. The method further includes bonding the first substrate to the second substrate, the first substrate being bonded to the second substrate such that a topmost dielectric layer of the first dielectric layers contacts a topmost dielectric layer of the second dielectric layers, and forming a second seal ring structure extending through the topmost dielectric layers of first and second dielectric layers.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    providing a first chip, the first chip having a substrate and a plurality of dielectric layers on a first surface of the substrate, the plurality of dielectric layers having metallization layers formed therein, the substrate having active devices in a first region of the substrate, an isolation region in a second region of the substrate extending from the first surface of the substrate into the substrate, the isolation region separating the substrate from the plurality of dielectric layers in the second region of the substrate;
    bonding a first surface of the plurality of dielectric layers of the first chip to a second surface of a second chip;
    removing the substrate in the second region, wherein the removing the substrate exposes the isolation region;
    forming a first conductive feature in the second region extending from the first chip to a metallization layer in the second chip; and
    forming a first seal ring structure in the second region extending from the first chip to the second chip.

2. The method of claim 1, wherein the forming the first conductive feature and the forming the first seal ring structure are performed at a same time.

3. The method of claim 1, wherein the forming the first seal ring structure further comprises:
    forming a first opening extending from a backside of the substrate through the plurality of dielectric layers to the second chip; and
    forming a conductive material in the first opening.

4. The method of claim 3, wherein the forming the first conductive feature further comprises:
    forming a second opening extending from the backside of the substrate through the plurality of dielectric layers to the metallization layer in the second chip, the second opening being laterally spaced from the first opening; and
    forming the conductive material in the second opening.

5. The method of claim 1 further comprising:
    forming a second seal ring structure in the second chip, the first seal ring structure directly contacting the second seal ring structure.

6. The method of claim 1, wherein the first chip is a backside-illuminated sensor and the second chip is a logic circuit.

7. The method of claim 1, wherein the first conductive feature electrically couples the first chip to the second chip, and wherein the first seal ring structure is not electrically coupled to any active devices.

8. A method of forming a semiconductor device, the method comprising:
    providing a first substrate having one or more overlying first dielectric layers and a first conductive interconnect in the one or more first dielectric layers;
    providing a second substrate having one or more overlying second dielectric layers, a second conductive interconnect in the one or more second dielectric layers, and a first seal ring structure in the one or more second dielectric layers;
    bonding the first substrate to the second substrate, the first substrate being bonded to the second substrate such that a topmost dielectric layer of the first dielectric layers contacts a topmost dielectric layer of the second dielectric layers;
    forming a first conductive feature extending through the one or more first dielectric layers and the topmost dielectric layers of first and second dielectric layers to the second conductive interconnect in the one or more second dielectric layers, the first conductive feature having a first width in the one or more first dielectric layers; and
    forming a second seal ring structure extending through the one or more first dielectric layers and the topmost dielectric layers of first and second dielectric layers, the second seal ring structure having the first width in the one or more first dielectric layers, the second seal ring structure being electrically isolated from the first conductive feature.

9. The method of claim 8, wherein forming the second seal ring structure further comprises:
    forming a first opening extending through the one or more overlying first dielectric layers to the first seal ring structure in the one or more second dielectric layers; and
    forming a conductive material in the first opening.

10. The method of claim 9, wherein the forming the first conductive feature coupling the first substrate to the second substrate comprises
    at a same time as the forming the first opening, forming a second opening through the one or more overlying first dielectric layers to the second conductive interconnect in the one or more second dielectric layers; and
    at a same time as forming the conductive material in the first opening, forming the conductive material in the second opening.

11. The method of claim 8, wherein the second seal ring structure is along a periphery of the first and second substrates.

12. The method of claim 8, wherein the first substrate, the one or more overlying first dielectric layers, and the first conductive interconnect comprise a backside-illuminated sensor and the second substrate, the one or more overlying second dielectric layers, and the second conductive interconnect comprise a logic circuit.

13. The method of claim 8, wherein the first conductive feature electrically couples the first conductive interconnect to the second conductive interconnect, wherein the second seal ring structure is not electrically coupled to any active devices.

14. A method comprising:
    bonding a first surface a first chip to a second surface of a second chip, the first chip having a substrate and a plurality of dielectric layers on a front side of the substrate, the substrate having a backside opposite the front side, the substrate having active devices in the front side in a first region, the substrate having an isolation region in the front side in a second region adjacent the first region, the isolation region extending from the front side of the substrate into the substrate, the plurality of dielectric layers having metallization layers formed therein;
    patterning the substrate, wherein the patterning the substrate exposes a first surface of the isolation region in the second region of the substrate, the first surface of the isolation region being parallel to a major surface of the substrate;

forming a first conductive feature in the second region of the substrate, the first conductive feature extending from the isolation region of the first chip to a metallization layer in the second chip; and forming a first seal ring structure in the second region of the substrate, the first seal ring structure extending from the isolation region of the first chip to a second seal ring structure in the second chip.

15. The method of claim 14, wherein the forming the first conductive feature and the forming the first seal ring structure are performed at a same time.

16. The method of claim 14, wherein the forming the first seal ring structure further comprises:

forming a first opening extending from the isolation region of the first chip through the plurality of dielectric layers to expose a portion of the second seal ring structure in the second chip; and forming a conductive material in the first opening.

17. The method of claim 16, wherein the forming the first conductive feature further comprises:

forming a second opening extending from the isolation region of the first chip through the plurality of dielectric layers to the metallization layer in the second chip, the second opening being laterally spaced from the first opening; and forming the conductive material in the second opening.

18. The method of claim 17, wherein the conductive material fills the first opening and the second opening.

19. The method of claim 14, wherein the first seal ring structure directly contacts the second seal ring structure.

20. The method of claim 1, wherein the first conductive feature and the first seal ring structure have surfaces level with a surface of the isolation region.

* * * * *